United States Patent [19]
Fujita

[11] Patent Number: 5,199,052
[45] Date of Patent: Mar. 30, 1993

[54] RELOAD TIMER CIRCUIT

[75] Inventor: Atsushi Fujita, Hachioji, Japan

[73] Assignee: Fujitsu Limited, Kawasaki, Japan

[21] Appl. No.: 723,890

[22] Filed: Jul. 1, 1991

[30] Foreign Application Priority Data

Jun. 29, 1990 [JP]  Japan .................... 2-174284

[51] Int. Cl.⁵ ............... H03K 23/56; H03K 21/02
[52] U.S. Cl. ........................ 377/20; 377/45;
   377/51; 377/116; 377/55; 328/129.1; 395/550
[58] Field of Search ............ 377/20, 45, 55, 56,
   377/107, 51, 116; 328/129.1; 395/550

[56] References Cited

U.S. PATENT DOCUMENTS

| | | | |
|---|---|---|---|
| 4,330,751 | 5/1982 | Swain | 377/107 |
| 4,546,487 | 10/1985 | Dackow | 377/20 |
| 4,713,832 | 12/1987 | Hutson | 377/45 |
| 4,724,421 | 2/1988 | Simison et al. | 377/20 |
| 4,870,664 | 9/1989 | Hayash | 377/107 |
| 5,063,355 | 11/1991 | Sasaki et al. | 328/129.1 |

FOREIGN PATENT DOCUMENTS 57-101991  6/1982  Japan .

*Primary Examiner*—John S. Heyman
*Attorney, Agent, or Firm*—Nikaido, Marmelstein, Murray & Oram

[57] ABSTRACT

A reload timer circuit comprises an n-bit up/down counter circuit for receiving input data of n bits and providing up/down count data of n bits; an n-bit timer circuit for receiving the n-bit up/down count data and providing timer data of n bits; and a timer period setting means for generating a timer period signal in response to an overflow signal of the n-bit timer data and providing the n-bit up/down counter circuit with the timer period signal. This reload timer circuit automatically sets a reload value by hardware without relying on software, thereby reducing the load on a central processing unit.

18 Claims, 11 Drawing Sheets

PROBLEMS OF PRIOR ART

PROBLEMS OF PRIOR ART

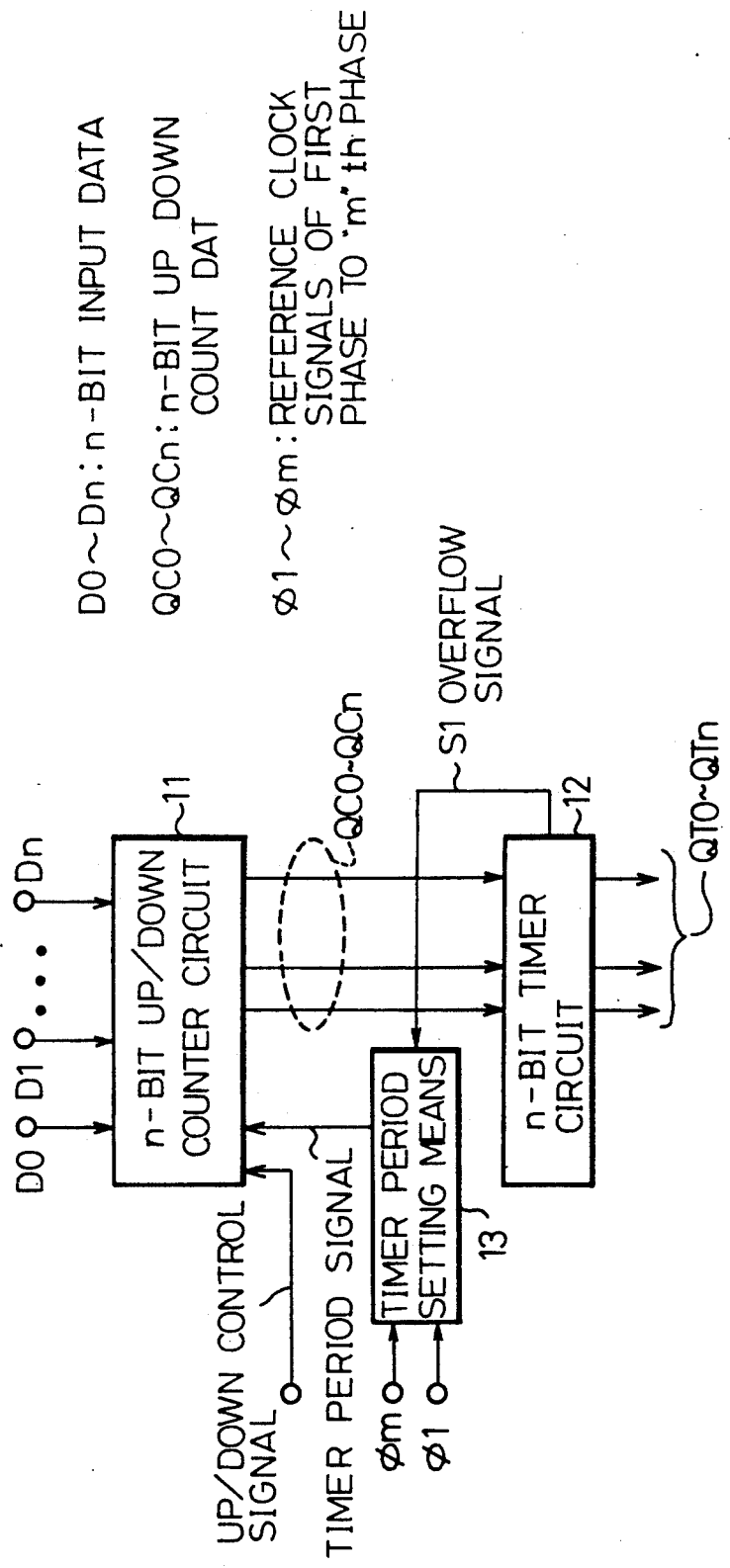

| Fig. 4A | Fig. 4B |

```
RELOAD VALUES                    TIMER VALUES
  5 →   0 1 0 1 →  0 1 0 1        5
                   0 1 0 0        4
                   0 0 1 1        3
                   0 0 1 0        2
                   0 0 0 1        1
                   0 0 0 0        0
  6 →   0 1 1 0 →  0 1 1 0        6
                   0 1 0 1        5
                   0 1 0 0        4
                   0 0 1 1        3
                   0 0 1 0        2
                   0 0 0 1        1
                   0 0 0 0        0
  7 →   0 1 1 1 →  0 1 1 1        7
                   0 1 1 0        6
                   0 1 0 1        5
                   0 1 0 0        4
                   0 0 1 1        3
                   0 0 1 0        2
```

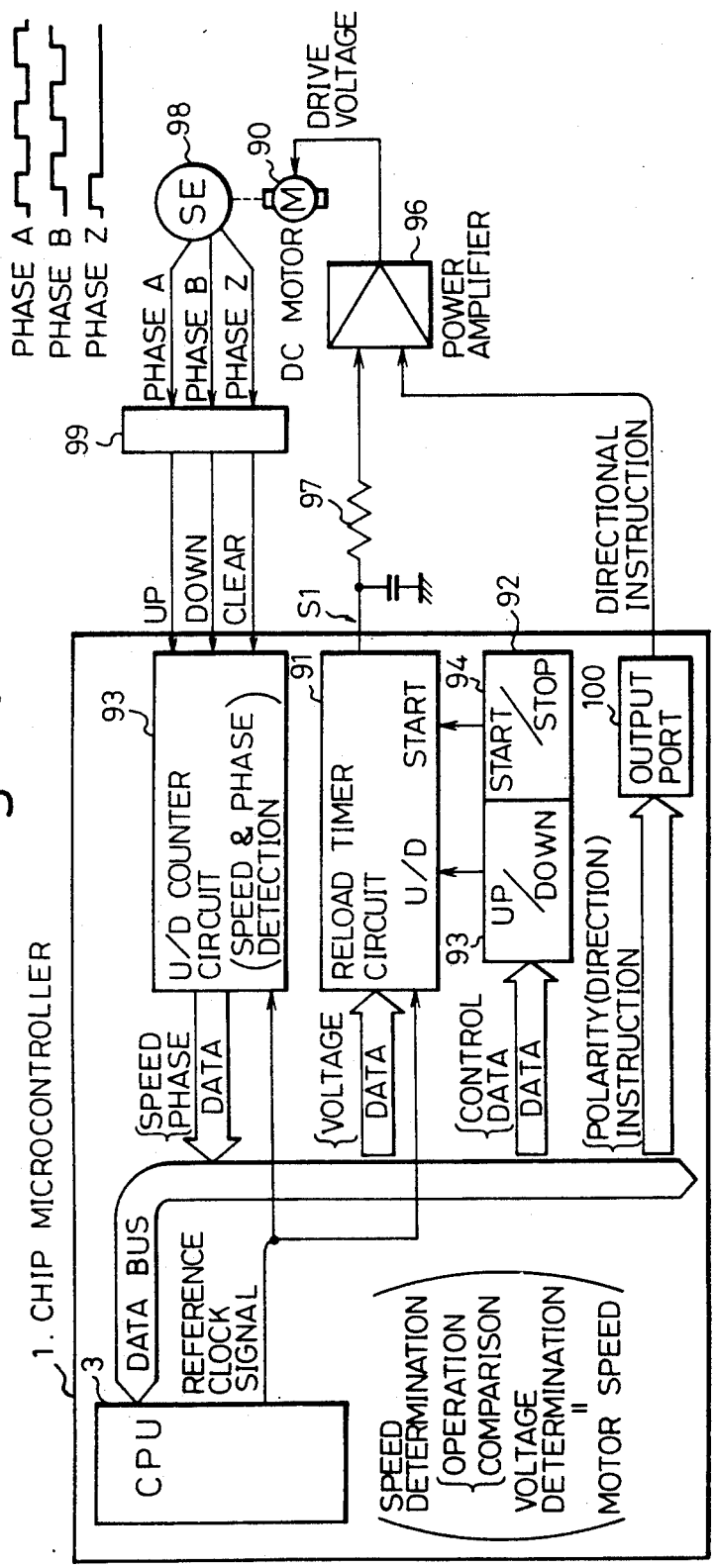
Fig.9a
Fig.9b TIMER PERIOD
Fig.9c PERIODIC PULSE S1
Fig.9d ANALOG OUTPUT
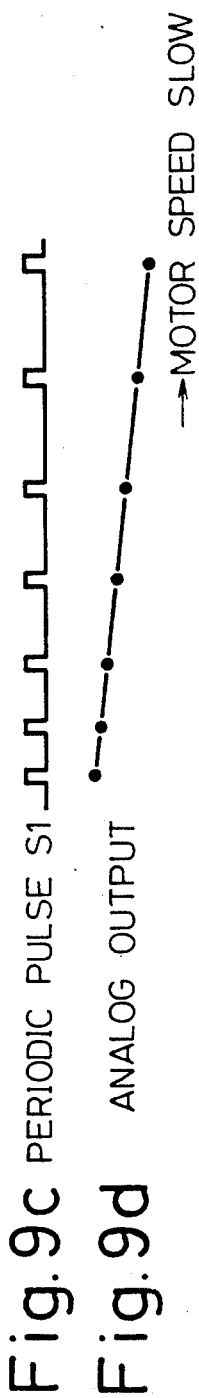

Fig. 10
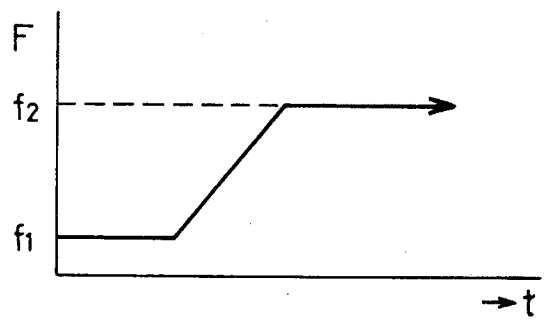
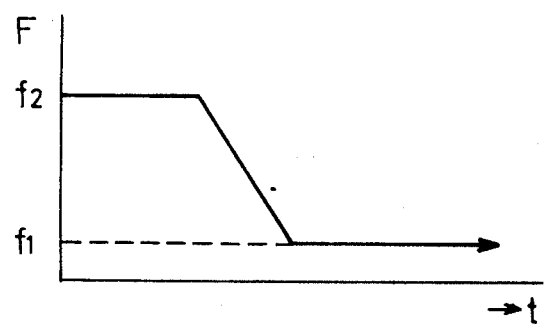
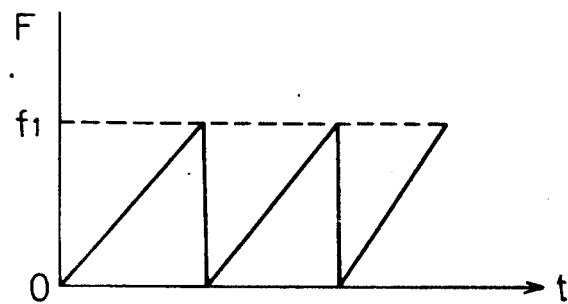

5,199,052

RELOAD TIMER CIRCUIT

BACKGROUND OF THE INVENTION

1. Field of the Invention

This invention relates to a reload timer circuit, and more particularly, to a reload timer circuit by which a reload value is rewritten to thereby gradually change a period of an n-bit timer signal.

2. Description of the Related Art

Due to the demand for an improved control technology, for increasing the speed and efficiency of microcomputers, many functions carried out so far by software are being gradually replaced with hardware.

As an example, a conventional reload timer circuit serving as a peripheral circuit of a microcomputer will be explained. The reload timer circuit changes a reload value to thereby gradually change the period of a timer signal, and to rewrite the reload value of the reload timer circuit, a central processing unit (CPU) must issue an interrupt request, which causes an overload of the CPU software and hinders the execution of other programs.

An operation of a typical conventional reload timer circuit will be explained with reference to FIG. 1.

In the figure, the reload timer circuit for providing a timer signal having a period which is gradually changed comprises a 4-bit reload register circuit 1 and a 4-bit timer circuit 2. The 4-bit reload register circuit 1 includes four flip-flops FR21 to FR24 connected to a bus 4. The 4-bit timer circuit 2 includes four flip-flops FT21 to FT24.

The 4-bit reload register circuit 1 receives input data of four bits D0 to D3 from a CPU 3 in response to a first write signal WR12, and provides the 4-bit timer circuit 2 with reload data of four bits QC00 to QC13 in response to a second write signal WR22 provided by and AND gate in accordance with a count clock signal CK22 provides timer data of four bits QT0 to QT3 in responses to the count clock signal CK22.

Thereafter, the CPU 3 provides, based on the first write signal WR12, the flip-flops FR21 to FR24 of the 4-bit reload register circuit 1 with the next input data of four bits D0' to D3' that are different from the data D0 to D3 stored in the 4-bit reload register circuit 1. The new data D0' to D3' are transferred from the reload register circuit 1 to the timer circuit 2 when the second write signal WR22 again rises, and the timer circuit 2 then carries out a counting operation at a timer period defined by the new data D0' to D3' and different from that defined by the previous data D0 to D3.

By repeating the above process and by utilizing software, the reload timer circuit provides gradually changes a period of a timer signal.

Namely, the CPU 3 relies on a software program to rewrite the reload data QC00 to QC13, to thus gradually change the timer period, and this technique overloads the CPU 3 and hinders the execution of other programs.

FIG. 2(a) is a characteristic diagram showing a D/A conversion process carried out through, for example, a pulse width modulator (PWM), wherein after receiving a level conversion request, the CPU 3 controls the PWM to smoothly shift a level from L1 to L2.

The level is shifted from L1 to L2 by controlling a high level width ratio of a timer signal to a low level. For example, the low level width of the timer signal is fixed, and the high level width of the signal is changed according to the period of the timer signal.

This will be explained in more detail with reference to FIG. 2(b). In a state (1) at the level L1, the CPU 3 writes, according to a program, a reload value of, for example, 0101 in the 4-bit reload register circuit 1, so that the 4-bit timer circuit 2 can count down from 5 to 0 to reach a state (2). When the count reaches 0, the CPU 3 write the next reload value of, for example, 0110 in the register circuit 1, so that the timer circuit 2 can count down from 6 to 0 to reach a state (3). This operation is repeated to gradually extend the period of the timer circuit 2 until a state (4) is attained.

Accordingly, the conventional technique changes the level of an analog value from L1 to L2 by executing a CPU program in such a way as to change input data stored in the reload register circuit 1 at a predetermined timing (in the above example, the input data is incremented), to thereby change the period of the timer circuit 2.

According to this example, an ON duty ratio of an output signal of the timer circuit 2 is increased, and a voltage or each period is averaged by, for example, an integration circuit, to thereby provide a voltage value corresponding to the timer period. This technique, however, must change data at each of the predetermined timings (1) to (4). In addition, to smoothly shift the level, the CPU 3 must change the data more frequently, and this may lower the efficiency. Whenever the states (1) to (4) are changed from one state to the next, the CPU 3 must terminate other program executions and issue an interrupt request to rewrite a reload value for the timer circuit 2. This may overload the CPU 3, hinder the execution of other programs, and prevent a high-speed processing.

Therefore, it is required to provide a timer circuit provided with hardware for automatically setting a reload value, once an initial reload value is set in a register, to thereby lighten the load of the CPU software.

SUMMARY OF THE INVENTION

To meet this requirement, an object of the invention is to provide a reload timer circuit having hardware that automatically sets a reload value without relying on software, to thereby reduce the load on a central processing unit.

To accomplish the above object, a reload timer circuit according to the invention basically comprises an n-bit counter circuit for receiving input data of n bits and providing count data of n bits based upon a counting operation thereof in response to a counting operation signal (S2) later explained;

an n-bit timer circuit for receiving the n-bit count data and providing timer data of n bits; and a timer period setting means for generating a timer period signal in response to an overflow signal of the n-bit timer data and providing the n-bit counter circuit with the timer period signal as a counting operation signal (S2). The more specifically, the reload timer circuit of the present invention further comprises a n-bit up/down counter circuit for receiving input data of n bits and providing up/down count data of n bits, an n-bit timer circuit for receiving the up/down count data of n bits and providing timer data of n bits, and a timer period setting unit for generating a timer period signal according to an overflow signal of the n-bit timer data and providing the timer period signal to the n-bit up/-down counter circuit.

Referring to FIG. 3, the timer period setting unit 13 of the invention generates a timer period signal S2 according to an overflow signal S1 of timer data of n bits QT0 to QTn, and feeds the timer period signal S2 to the n-bit up/down counter circuit 11.

The n-bit up/down counter circuit 11 receives input data of n bits D0 to Dn, and provides a n-bit timer circuit 12 with up/down count data of n bits QC0 to QCn. The n-bit timer circuit 12 generates timer data of n bits QT0 to QTn based on the up/down count data QC0 to QCn. While sequentially counting up or down the timer data QT0 to QTn, the timer circuit 12 provides the overflow signal S1 of the timer data QT0 to QTn to the timer period setting unit 13 and thereafter, the timer period setting unit 13 changes the count data stored in the counter circuit 11 by a predetermined quantity.

Unlike the prior art, the invention does not rely on CPU software when dealing with a request for a gradual change of a timer period. Namely, the invention only carries out an initial setting process, and then the timer period setting unit 13 generates the timer period signal S2, and according to the signal S2 and m-phase reference clock signals $\phi 1$ to $\phi m$, the up/down count data QC0 to QCn (a reload value) are changed to optionally set a timer period.

This arrangement reduces the former repetitions of the reload value setting process to only one for an initialization, reduces the load on the CPU software, and enables the CPU to efficiently execute other programs at a high speed.

BRIEF DESCRIPTION OF THE DRAWINGS

FIG. 3 is a block diagram showing the principle of a reload timer circuit according to the invention;

FIGS. 9a and 9b show a block diagram of a motor speed control system employing the reload timer circuit of the invention with explanatory waveforms; and FIG. 10 is a view showing various patters of changes of a counter period.

DESCRIPTION OF THE PREFERRED EMBODIMENTS

Embodiments of the invention will be explained with reference to the drawings.

FIG. 3 is a block diagram showing the principle of a reload timer circuit according to the invention.

The counter circuit used in the reload timer circuit of the present invention may be an up-counter or a down counter and further when a case requires, it may be an up/down counter. Therefore, in the following example, a reload timer circuit having an up/down counter is disclosed but it is apparent that this invention is not restricted to this embodiment.

The reload timer circuit comprises an n-bit up/down counter circuit 11 for providing up/down count data of n bits QC0 to QCn according to input data of n bits D0 to Dn and an up/down control signal U/D; an n-bit timer circuit 12 for receiving the up/down count data QC0 to QCn and providing timer data of n bits QT0 to QTn; and a timer period setting unit 13 for generating a timer period signal S2 according to an overflow signal S1 of the timer data QT0 to QTn and providing the n-bit up/down counter circuit 11 with the timer period signal S2.

Figure 1:
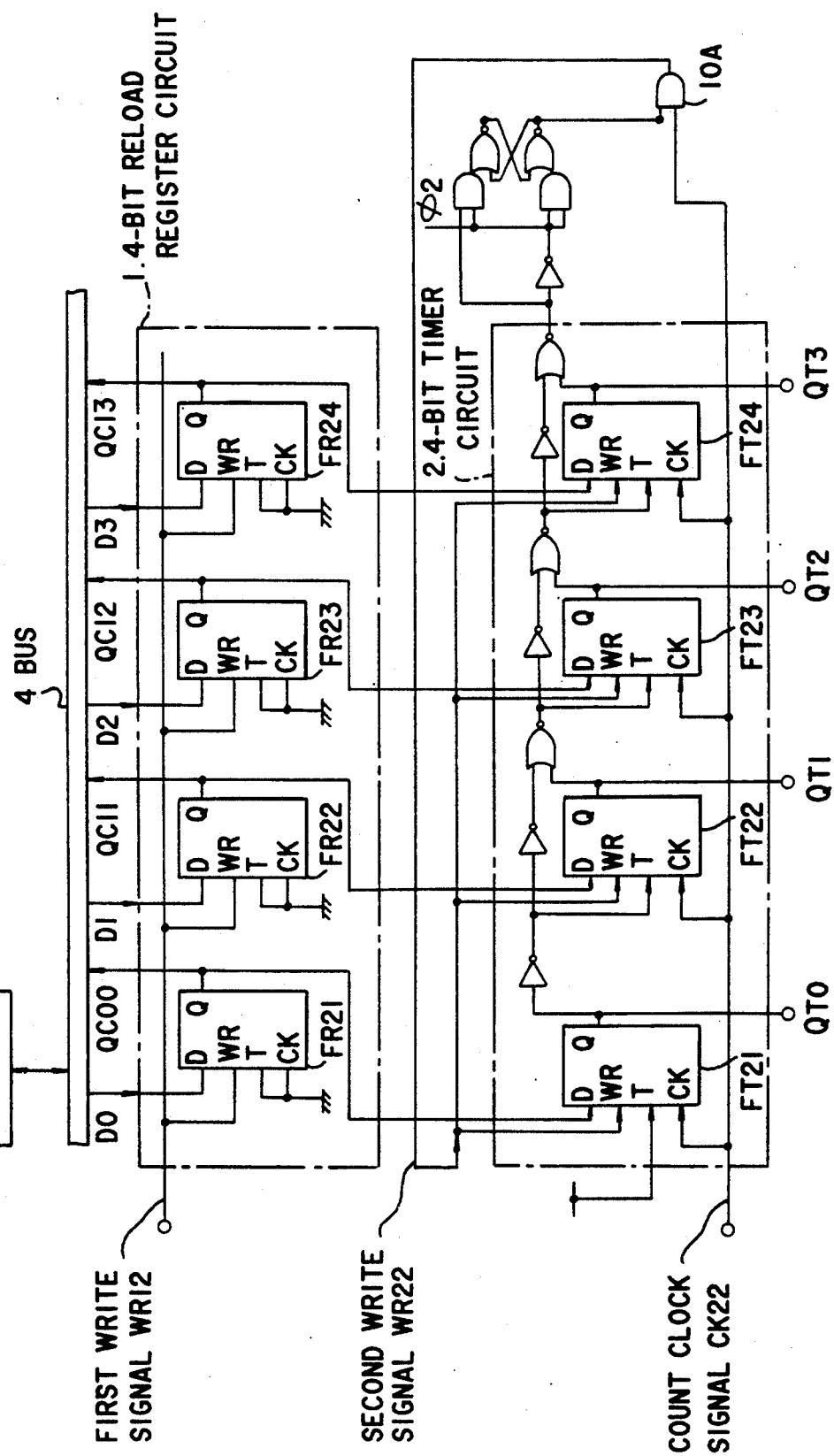
FIG. 1 is a circuit diagram showing a reload timer circuit according to a prior art.

Whenever receiving the overflow signal S1, the timer period setting unit 13 of the invention rewrites the timer period defining data stored in the up/down counter circuit 11. More precisely, the data stored in the counter circuit 11 is incremented or decremented by one or by a few according to the output of the timer period setting unit 13. Namely, the timer period setting unit 13 adds a counter function to the conventional register circuit 1 of FIG. 1 that is a simple memory circuit. The timer period setting unit 13 generates, in response to m-phase reference clock signals $\phi 1$ to $\phi m$, the timer period signal S2 by which the data stored in the counter circuit 11 is rewritten.

Figures 4, 4A:
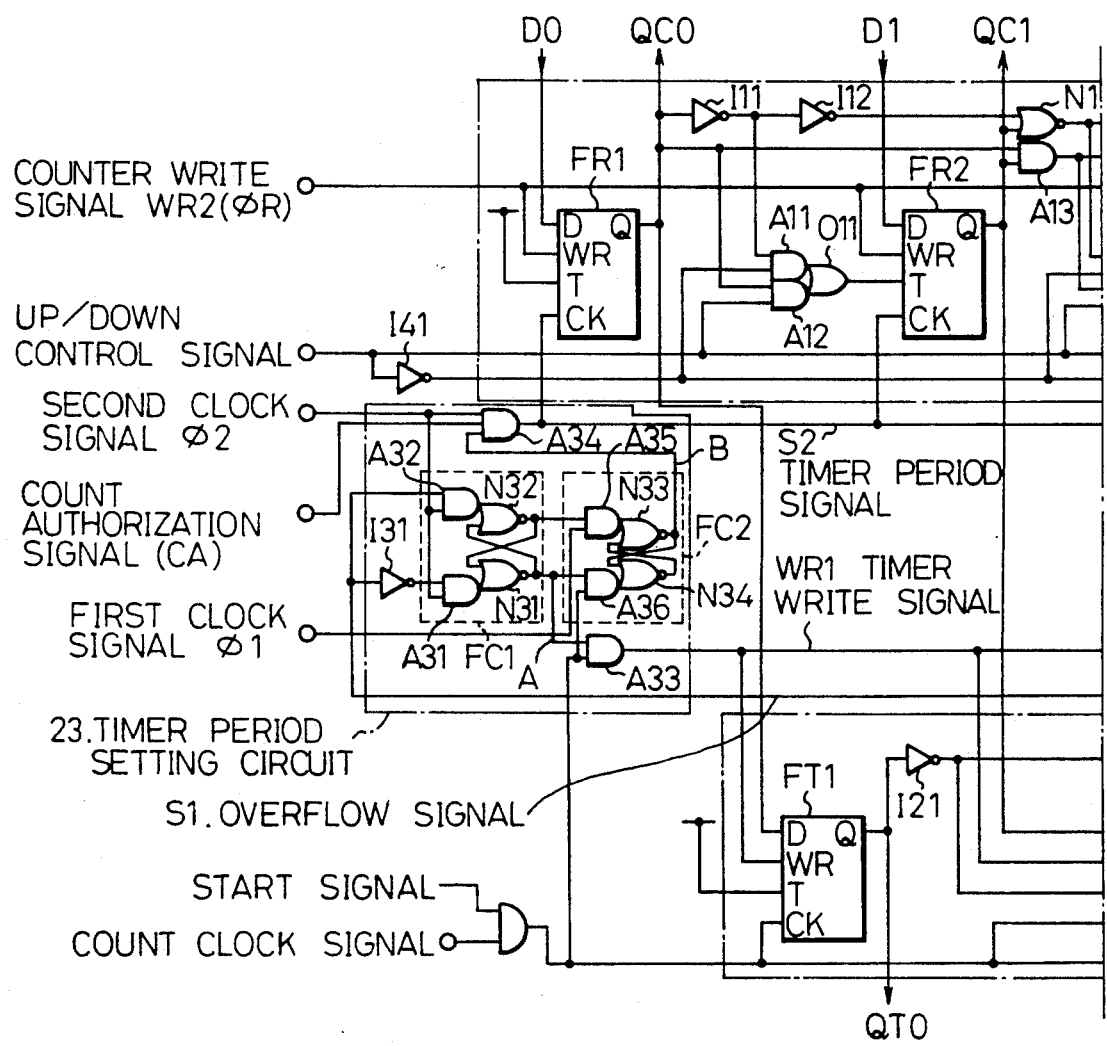
FIGS. 4, 4A, 4B are circuit diagrams showing a reload timer according to an embodiment of the invention.
Figure 4B:
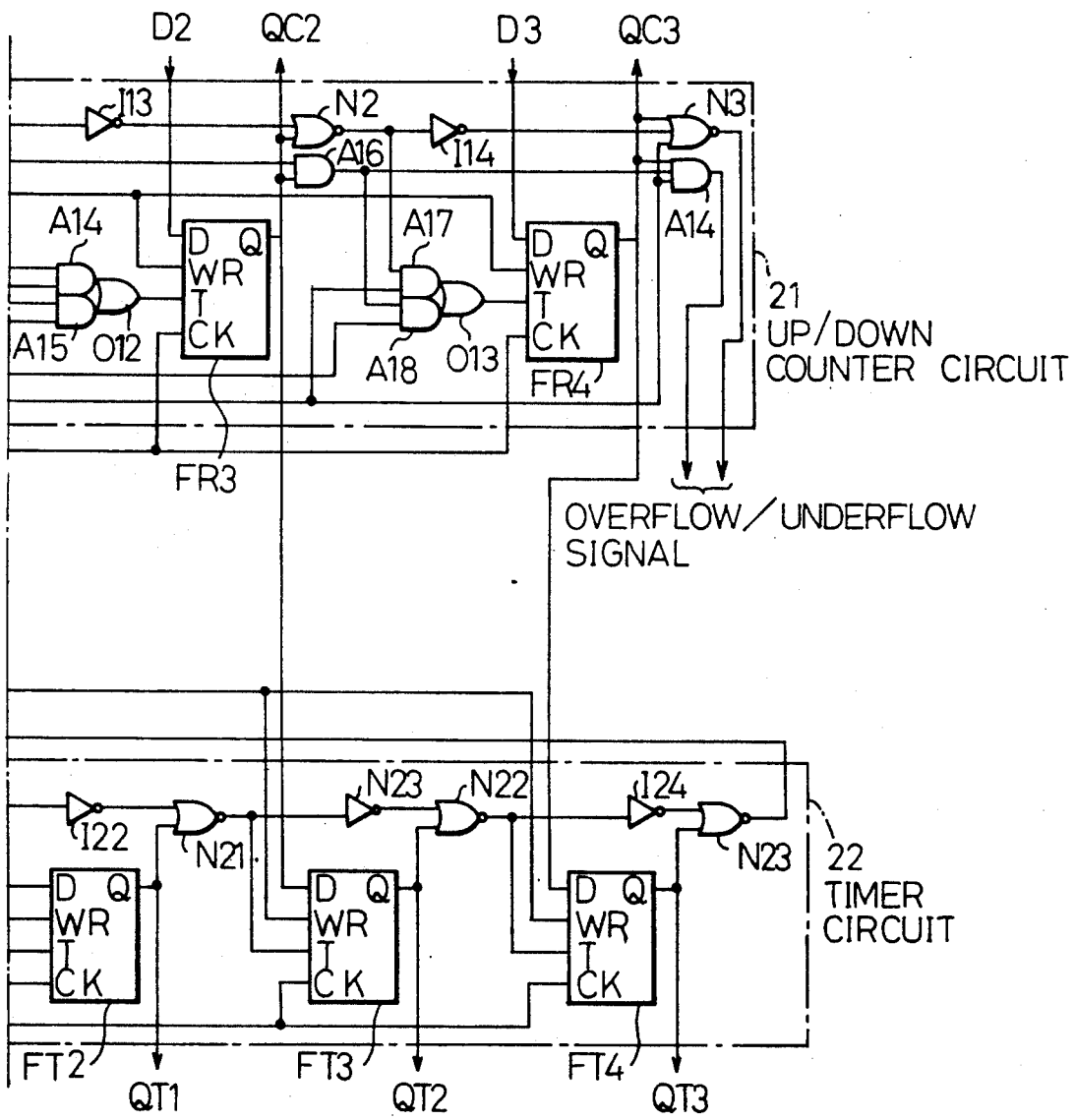
Figures 5, 7:
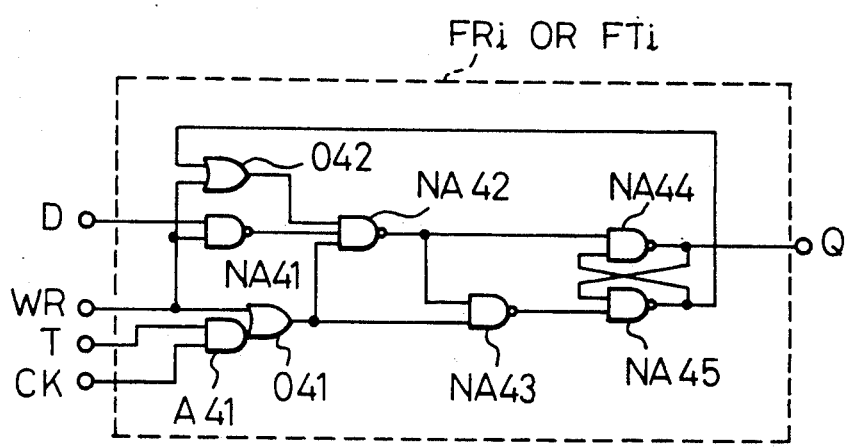
FIG. 5 is a circuit diagram showing a flip-flop of the embodiment of the invention.
FIG. 7 is a supplemental view explaining the time chart of FIG. 6.

FIGS. 4 to 7 explain a reload timer circuit according to an embodiment of the invention, in which FIGS. 4A and 4B show a 4-bit reload timer circuit according to the embodiment, and FIG. 5 a flip-flop according to the embodiment.

In FIGS. 4A and 4B, a 4-bit up/down counter circuit 21 corresponding to the n-bit up/down counter circuit 11 of FIG. 3 provides up/down count data of four bits QC0 to QC3 according to input data of four bits D0 to D3 and an up/down control signal U/D. The up/down counter circuit 21 comprises four flip-flops FR1 to FR4, inverters I11 to I14 and NOR logic circuits N11 to N13 that detect carry bits, and AND logic circuits A11 to A19 and OR logic circuits 011 to 013 that detect a count-up or count-down direction.

In FIG. 5, each of the flip-flops FR1 to FR4 comprises an AND logic circuit A41, NAND logic circuits NA41 to NA43 and OR logic circuits 041 and 042 that control the writing of input data Di, and NAND logic circuits NA44 and NA45 that hold the input data Di.

A 4-bit timer circuit 22 corresponding to the n-bit timer circuit 12 of FIG. 3 receives the up/down count data QC0 to QC3, and provides timer data of four bits QT0 to QT3. The timer circuit 22 comprises four flip-flops FT1 to FT4, and inverters I21 to I25 and NOR logic circuits N21 to N23 that detect carry bits. The flip-flops FT1 to FT4 are he same as the flip-flops FR1 to FR4 (FIG. 5).

A timer period setting circuit 23 corresponding to the timer period setting unit 13 of FIG. 3 generates a timer period signal S2 according to an overflow signal S1 of the timer data QT0 the QT3, and provides the up/down counter 21 with the timer period signal S2. The timer period setting circuit 23 generates the timer period signal S2 according the overflow signal S1 as well as two-phase reference clock signals $\phi 1$ and $\phi 2$.

The timer period setting circuit 23 comprises an inverter I31 for inverting the overflow signal S1 provided by the NOR logic circuit N23 of the timer circuit 22, first and second flip-flops FC1 and FC2 for holding the overflow signal S1, an AND logic circuit A33 for detecting a start signal ST provided by a CPU, and an AND logic circuit A34 for providing the timer period signal S2.

An operation of the reload timer circuit with the above arrangement will be explained with reference to FIG. 6, which is a time chart showing an operation of the reload timer circuit, and FIG. 7, which is a supplementary view of the time chart of FIG. 6.

Figure 2A:
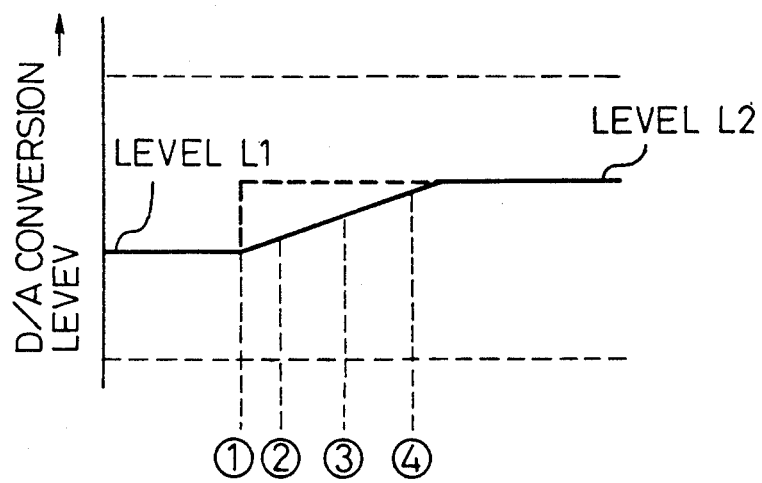
FIGS. 2a and 2b are a view explaining the problems of the prior art.
Figure 2B:
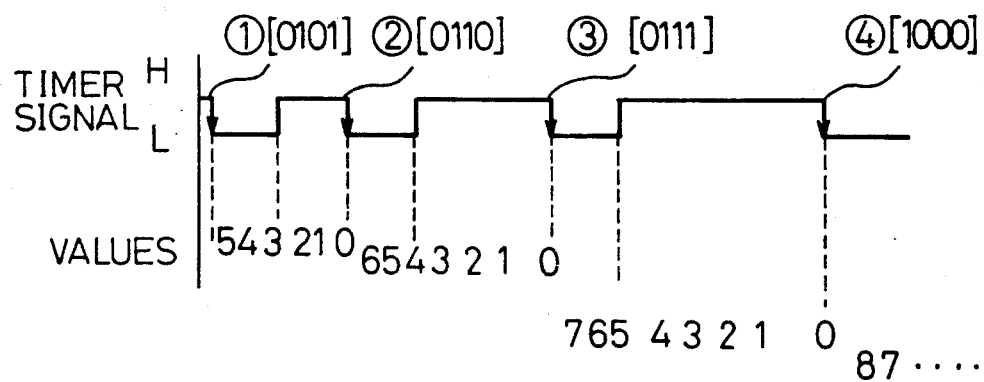
Figure 6:
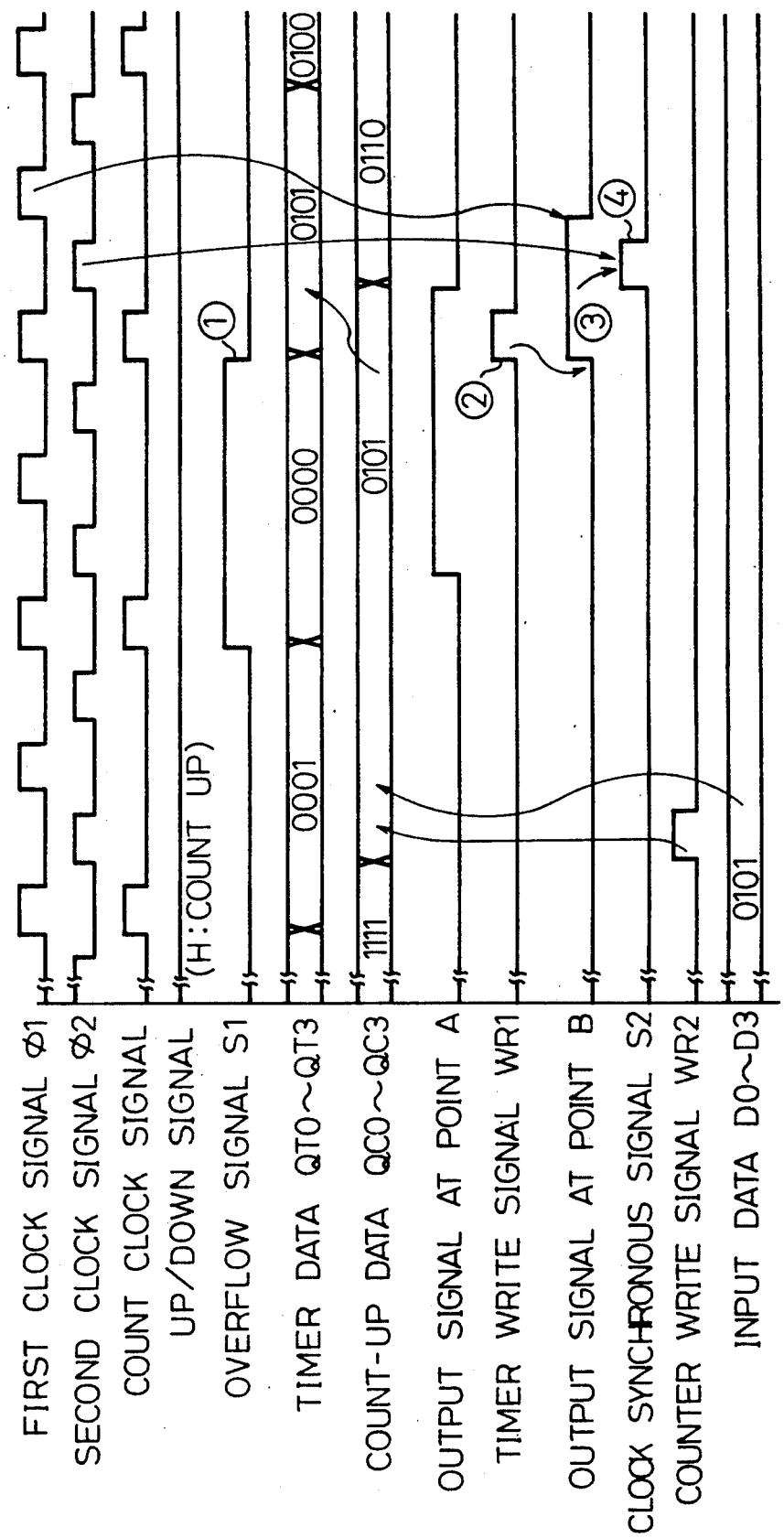
FIG. 6 is a time chart showing an operation of the reload timer circuit of the embodiment of the invention.

In FIG. 6, in an initializing state, the timer period setting circuit 23 receives the two-phase clock signals $\phi1$ and $\phi2$, and the timer circuit 22 receives an AND of the count clock signal CLK and start signal ST. It is assumed that an up/down state, and that the timer period is controlled to be sequentially increased from an initial value of 5 to 7 and so on, to shift an analog level accordingly, as shown in FIG. 2(b).

The invention uses the up/down control signal U/D to determine whether input data is increasing or decreasing, and only when it is one of them these stales is determined, provides the timer period signal S2 for increasing or decreasing the count data stored in the counter circuit 21. It is possible not to use the up/down control signal U/D, as the signal U/D may be generated in response to an instruction from the CPU.

The flip-flops FR1 to FR4 receive that input data of four bits D0 to D3, respectively, according to a counter write signal WR2 ($\phi$R), the start signal ST, the second clock signal $\phi2$, and a count authorization signal CA. The input data D0 to D3 represent a reload value of, for example, $5=0101$ that is previously determined by the CPU. Thereafter, the up/down counter circuit 21 provides the timer circuit 22 with the count-up data QC0 to QC3 as the reload value.

In more detail, previous timer data QT0 to QT3=0000 cause the overflow signal S1 to fall at a point (1) in FIG. 6. According to a timer write signal WR1 (2) generated at the fall (1) of the overflow signal S1, the reload value (0101) is supplied from the up/down counter circuit 21 to the timer circuit 22.

Before this process, the flip-flop FC1 of the timer period setting circuit 23 has data of high (H) level, and an output waveform at a point A of the flip-flop FC1 becomes H in synchronism of the second clock signal $\phi2$.

Meanwhile, the flip-flop FC2 of the timer period setting circuit 23 has data of level H at the fall (1) of he overflow signal S1, and an output waveform at a point B of the flip-flop FC2 becomes H because the timer write signal WR1 becomes H in synchronism with the first clock signal $\phi1$. As a result, the AND logic circuit A34 causes the timer period signal S2 to rise at (4) according to a rise (3) of the output waveform of the point B. The point B becomes low (L) in synchronism with the next rise of the first clock signal $\phi1$.

As a result, the data stored in the up/down counter circuit 21 is incremented by one to automatically set the next reload value of 0110 in the circuit 21. At the same time, the timer circuit 22 provides timer data QT0 to QT3 according to the present reload value of 0101.

As explained above, after the overflow signal S1 is provided and after a predetermined delay time, the count data stored in the up/down counter 21 are transferred to a memory of the timer circuit 22. After a delay time during which the transfer of the count data is completed, the timer period signal S2 is generated to increment or decrement the count data stored in the up/down counter circuit 21 by a predetermined value.

The invention, therefore, requires at least one delay circuit between the timer circuit 22 and the up/down counter circuit 21.

The flip-flop FC1 of the timer period setting circuit 23 serves as a first delay circuit for providing the delay time during which the count data stored in the up/down counter circuit 21 are transferred to a memory of the timer circuit 22 after the generation of the overflow signal S1. Also, the flip-flop FC2 serves as a second delay circuit for providing a delay time for rewriting a memory of the up/down counter circuit 21 after the count data stored in the memory are completely transferred to the memory of the timer circuit 22.

The timer circuit 22 carries out a count-down operation from a value of $5=0101$ to $4=0100$, $3=0011$, $2=0010$, and so on. When the timer data QT0 to QT3 for the reload value of 0101 become 0000, the next reload value of 0110 is transferred as the up/down count data QC0 to QC3 to the timer circuit 22. At this time, the timer period setting circuit 23 automatically sets the next reload value of 0111 in the up/down counter circuit 21 in response to the overflow signal S1.

Meanwhile, the timer circuit 22 generates timer data QT0 to QT3 for the reload value of 0110. Namely, it successively generates values $6=0110$, $5=0101$, $4=0100$, and so on. When the timer circuit 22 provides timer data QT0 to QT3 of 0000 for the reload value of 0110, the up/down counter circuit 21 transfers the next reload value of 0111 as up/down count data QC0 to QC3 to the timer circuit 22. At the same time, the timer period setting circuit 23 automatically sets the next reload value of 1000 in the up/down counter circuit 21 in response to the overflow signal S1.

Meanwhile, the timer circuit 22 successively provides timer data QT0 to QT3 of $7=0111$, $6=0110$, $5=0101$, $4=0100$, and so on for the reload value of 0111.

In this way, the timer period setting circuit 23 of the invention generates the timer period signal S2 in response to the overflow signal S1 provided by the timer circuit 22, and provides the up/down counter circuit 21 with the timer period signal S2 by which a count value stored in the counter circuit 21 is rewritten to change the period of the tier circuit 22.

After receiving the input data D0 to D3 of four bits and the up/down control signal U/D, the up/down counter circuit 21 provides the 4-bit timer circuit 22 with the up/down count data of four bits QC0 to QC3, and according to the up/down count data QC0 to QC3, the timer circuit 22 provides the timer data of four bits QT0 to QT3. While successively generating the timer data of four bits QT0 to QT3, the timer circuit 22 supplies the overflow signal S1 of the timer data QT0 to QT3 to the timer period setting circuit 34, Unlike the conventional techniques, the invention gradually changes a timer period without relying on CPU software. Namely, the invention automatically sets the next up/down count data (the next reload value) of four bits QC0 to QC3 based on the two-phase reference clock signals $\phi1$ and $\phi2$ and the timer period signal S2 provided by the timer period setting circuit 23.

Once an initial reload value is set, the invention automatically sets the following reload values, thereby greatly reducing the load on the software of the CPU, and the CPU, therefore, is able to efficiently execute other programs at high speed.

In the above explanation, the up/down control signal U/D has been assumed to indicate a count-up operation, but even if the control signal U/D indicates a count-down operation, a next reload value is automatically set according to the timer period signal S2.

In the above embodiment, count data to be set in the up/down counter circuit 21 has no limitation, and thus the period of the timer circuit 22 may be unlimitedly extended or shortened (to zero). It is sometimes necessary to set an upper limit or a lower limit on the count data. FIG. 10 shows modifications of the invention in which a time period is increased up to an upper limit and then kept at the upper limit, or decreased to a lower limit and then kept at the lower limit, or cyclically increased and decreased between the upper and lower limits.

Figures 8, 8A:
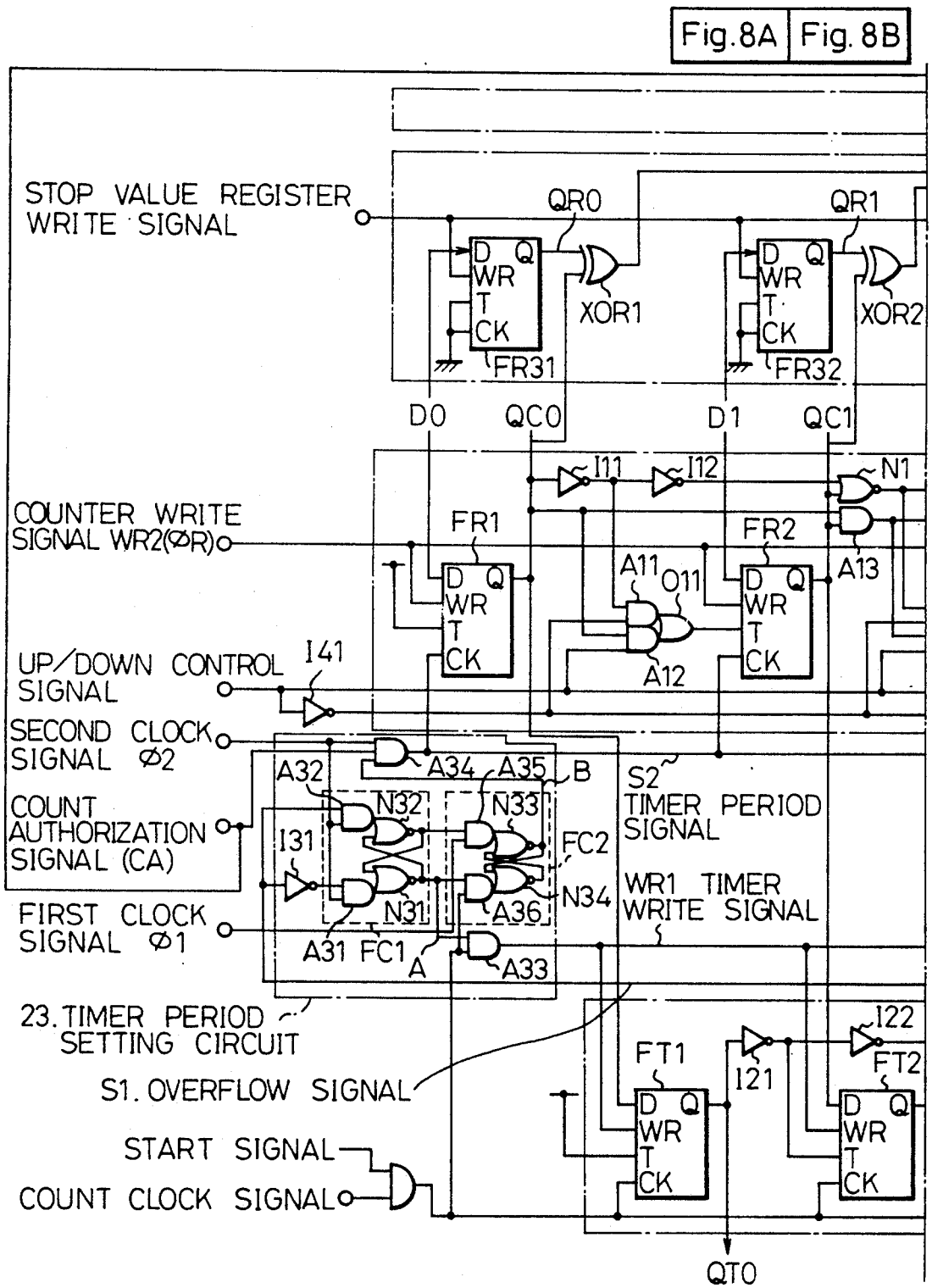
FIGS. 8, 8A and 8B are circuit diagrams showing another embodiment of the invention.

To achieve these modifications, the invention applies a predetermined control signal shown in FIG. 8 to the count authorization signal input CA of FIGS. 4A and 4B.

More precisely; the invention provides a separate register circuit for storing an upper or lower limit of a timer period. The upper or lower limit is always compared with count data stored in the up/down counter 21, and when they coincide with each other, a count stop signal is issued. Alternatively, the CPU 3 may be programmed to read the count data stored in the up/down counter circuit 21 whenever the overflow signal S1 is generated, and checks to see whether or not the count data coincide with the present upper of lower limit. Instead, the CPU 3 may find a difference between the read count data and the present upper or lower limit of timer period, and when there is no difference, issue the count stop signal.

Figure 8B:
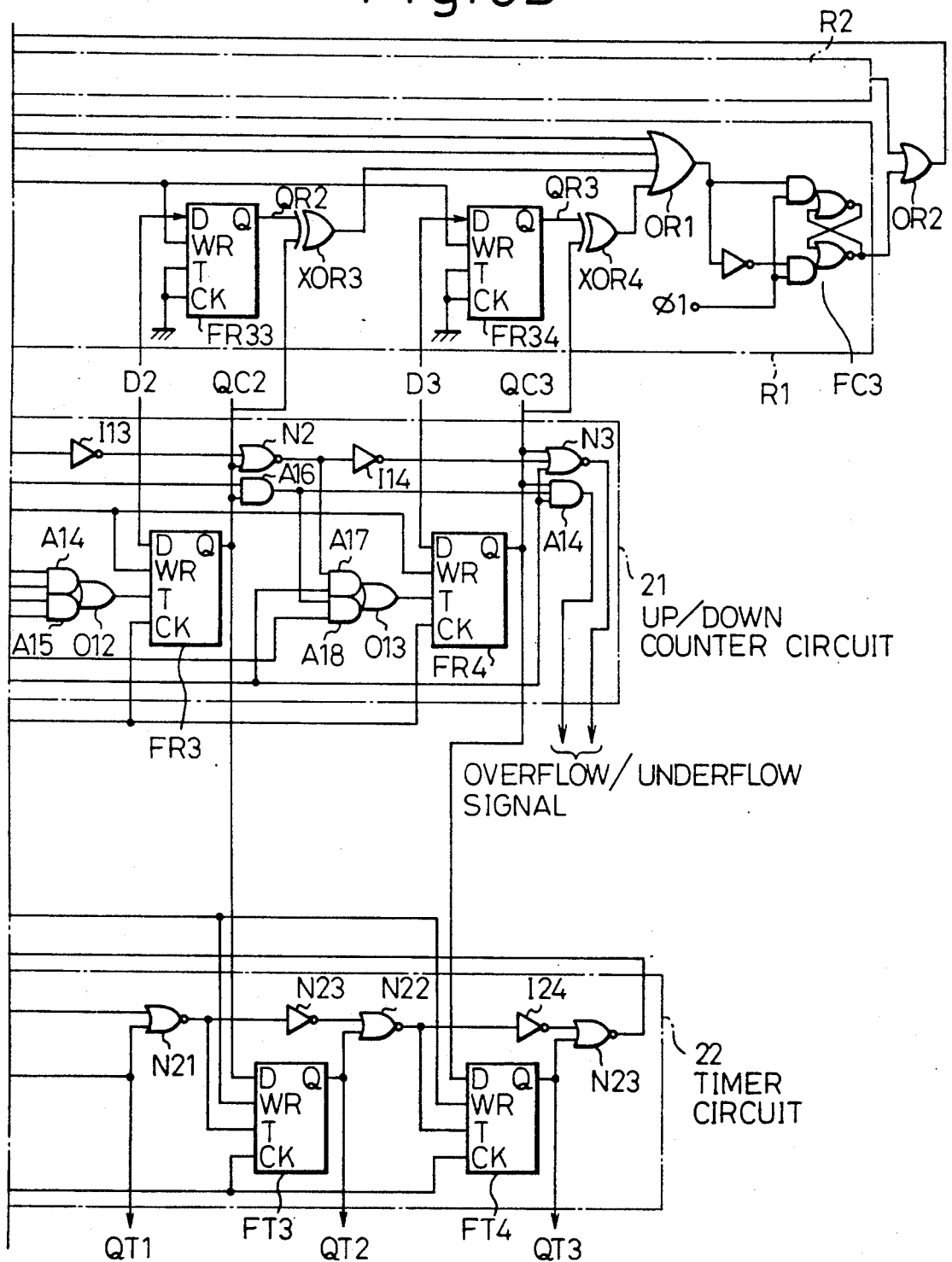

FIGS. 8A and 8B are circuit diagram showing a reload timer circuit having a separate register circuit for defining and controlling an upper limit or a lower limit, or both thereof, for restricting a timer period.

This reload timer circuit comprises the circuit of FIGS. 4A and 4B and, in addition, stop value registers R1 and/or R2 having an identical circuit configuration. The stop value register R1 (R2) comprises flip-flops FR31 to FR34 connected to input data D0 to D3, respectively. The flip-flops FR31 to FR34 are set with a predetermined upper or lower limit value in response to a stop value register write signal WR3.

Q-outputs of the flip-flops FR31 FR34 provide outputs QR0 to QR3, which are exclusive-ORed, in exclusive-OR gates XOR1 to XOR4, with Q-outputs QC0 to QC3 of the flip-flops FR1 to FR4 of the up/down counter circuit 21. Outputs of the exclusive-OR gates XOR1 to XOR4 are supplied to an OR gate OR1. An output of the OR gate OR1 is supplied to a delay circuit FC3 whose output is supplied to the count authorization signal input CA.

Unless the present count data QR0 to QR3 completely coincide with the count data QC0 to QC3 of the up/down counter circuit 21, the stop value register circuit R1 keeps the count authorization signal ON to continue a counting operation. If the data QR0 to QR3 completely coincide with the data QC0 to QC3, the AND gate A34 is turned OFF to stop the counting operation of the up/down counter circuit 21.

According to the embodiment, the stop value register R1 may have an upper limit, and the other stop value register R2 a lower limit. Outputs of the stop value registers R1 and R2 are ORed in an OR gate OR2 whose output is supplied to the count authorization signal input CA. The counting operation is stopped whenever the count data stored in the up/down counter circuit 21 coincide with any one of the upper and lower limits. The counter circuit 21 once stopped may be restarted by rewriting data in the stop value register or the up/down counter.

FIGS. 9a–9d show a motor speed controller employing the reload timer circuit of the invention with explanatory waveforms therefor.

In FIG. 9(a), the rotation of a motor 90 is detected by a shaft encoder 98, which provides output signals for phases A, B, and Z to an encoder 99, which provides signals UP, DOWN, and CLEAR. These signals are provided to an up/down counter circuit 93, which computes digital values representing speed and phase according to the provided signals. The digital values are once stored in a CPU 3. To activate the reload timer circuit of the invention, the CPU 3 supplies predetermined data such as a voltage value to an operational circuit 91 serving as the reload timer circuit. At the same time, a start/stop control circuit 94 of a control register 92 activates the up/down counter circuit and timer circuit of the reload timer circuit 91.

An up/down control signal generator 93 of the control register 92 is present with predetermined data for accelerating or decelerating the motor 90. The reload timer circuit 91 of the invention generates an overflow signal S1, which is supplied to an integration circuit 97 through a flip-flop 95 or a one-shot multivibrator serving as a waveform shaping circuit. The integration circuit 97 converts the input signal into analog data, which is supplied to a power amplifier 96. The power amplifier 96 provides a driving voltage for controlling the motor 90.

In this example of FIG. 9(a), the speed of the motor 90 is decreased, so that a timer period of the timer circuit 22 is gradually extended as shown in FIG. 9(b). Accordingly, the period of the overflow signal S1 becomes longer, and also the period of an output pulse of the flip-flop 95 becomes longer as shown in FIG. 9(c). The output of the flip-flop 95 is averaged by the integration circuit 97, so that an output voltage of the integration circuit 97 gradually decreases as shown in FIG. 9(d). As a result, an output of the power amplifier 96 gradually decreases to slow down the motor 90.

This example also has an output port 100 for controlling the rotational direction of the motor 90. The CPU 3, reload counter circuit 91, control register 92, output port 100, etc., are fabricated on a single microcomputer chip.

As explained above, the timer period setting means of the invention provides the n-bit up/down counter circuit with a timer period signal generated according to an overflow signal of n-bit timer data.

Unlike the conventional techniques, the invention gradually changes a timer period by using a timer period setting means to generate a timer period signal by which a next reload value is automatically set. This arrangement reduces the number of reload value setting processes to only one, for initialization.

The invention, therefore, drastically reduces the load on the CPU software, and enables the CPU to efficiently execute other programs at a high speed.

I claim:

1. A reload timer circuit comprising:
   an n-bit counter circuit for receiving input data of n bits and providing count data of n bits based upon a counting operation thereof in response to a counter operation signal (S2);
   an n-bit timer circuit for receiving n-bit count data and providing timer data of n bits; and a timer period setting means for generating a timer period signal in response to an overflow signal of the n-bit timer data and providing the n-bit counter circuit with the timer period signal as a counting operation signal, said timer period signal controlling the period of each pulse of the n-bit timer circuit.

2. A reload timer circuit according to claim 1, wherein said counter circuit counts up a counter value thereof in response to said counting operation signal (S2).

3. A reload timer circuit according to claim 1, wherein said counter circuit counts down a counter value therof in response to said counting operation signal (S2).

4. A reload timer circuit according to claim 1, wherein said counter circuit comprises an up/down controlling means for selecting any one of a counting-up function and a counting-down function of the counter circuit in response to an up/down counter (U/D) indicating the counting-up operation or the counting-down operation of the counter circuit.

5. A reload timer circuit according to claim 1, wherein said counter circuit selectively operates for counting-up operation or the counting down operation in response to an up/down counter (U/D) indicating the counting-up operation or the counting down operation of the counter circuit and said counting operation signal (S2).

6. A reload timer circuit as set forth in claim 5, wherein the n-bit up/down counter circuit provides the n-bit up/down count data according to the n-bit input data as well as data provided by a means for determining the direction of a change in the n-bit input data.

7. A reload timer circuit as set forth in claim 6, wherein the means for determining the direction of a change in the n-bit input data is an up/down counter.

8. A reload timer circuit as set forth in claim 6, wherein the means for determining the direction of a change in the n-bit input data is an operation means incorporating a proper program.

9. A reload timer circuit as set forth in claim 5, wherein the timer period setting means changes the n-bit up/down count data stored in the n-bit up/down counter circuit by a predetermined value in response to a generation of the overflow signal.

10. A reload timer circuit as set forth in claim 5, wherein the n-bit timer circuit carries out a count-up or count-down operation from an initial value to a predetermined value, and generates the overflow signal when the predetermined value is attained.

11. A reload timer circuit as set forth in claim 5, wherein the timer period setting means transfers the n-bit up/down count data stored in the n-bit up/down counter circuit to the n-bit timer circuit in response to the overflow signal, and after the completion of the transfer, rewrites the n-bit up/down count data stored in the n-bit up/down counter circuit.

12. A reload timer circuit as set forth in claim 11, wherein the timer period setting means includes at least a delay circuit.

13. A reload timer circuit as set forth in claim 9, wherein the timer period setting means changes the n-bit up/down count data stored in the n-bit up/down counter circuit by a predetermined value in response to a generation of the overflow signal until the n-bit up/down count data reaches a predetermined limit.

14. A reload timer circuit as set forth in claim 13, wherein the timer period setting means changes the n-bit up/down count data stored in the n-bit up/down counter circuit by a predetermined value in response to a generation of the overflow signal until the n-bit up/down count data reaches the predetermined limit, and thereafter, repeats this process after initializing the up/down count data.

15. A reload timer circuit as set forth in claim 13, wherein the timer period setting means includes a stop setting register for storing predetermined n-bit data used to stop changing the n-bit up/down count data, and providing a function to stop changing the value of the data to the n-bit up/down counter circuit when the predetermined n-bit data coincide with the n-bit up/down count data.

16. A reload timer circuit as set forth in claim 13, wherein the timer period setting means is connected to a proper operation means, the operation means including a counter for storing a predetermined initial value, decrementing the counter whenever the overflow signal is generated, and stopping the function of the timer period setting means when the counter counts a predetermined value.

17. A reload timer circuit as set forth in claim 10, wherein said reload timer circuit is connected to a processing means (CPU) through a data-bus and thereby an initial value of the data being set in said n-bit up/down counter circuit thereof from said processing means (CPU) and an up/down controlling signal (U/D) being supplied thereto.

18. A reload timer circuit as set forth in claim 15, wherein said reload timer circuit is connected to a processing means (CPU) through a data-bus and thereby a predetermined n-bit data is supplied from said processing means (CPU) to a stop value register.

* * * * *